United States Patent
Lee et al.

(10) Patent No.: US 7,230,828 B2
(45) Date of Patent: Jun. 12, 2007

(54) HEAT DISSIPATION DEVICE

(75) Inventors: Hsieh Kun Lee, Tu-Chen (TW); Cui Jun Lu, Shenzhen (CN); MingXian Sun, Shenzhen (CN)

(73) Assignees: Fu Zhun Precision Ind. (Shenzhen) Co., Ltd., Shenzhen (CN); Foxconn Technology Co., Ltd., Tu-Cheng (TW)

( * ) Notice: Subject to any disclaimer, the term of this patent is extended or adjusted under 35 U.S.C. 154(b) by 289 days.

(21) Appl. No.: 10/946,721

(22) Filed: Sep. 21, 2004

(65) Prior Publication Data

US 2005/0088821 A1    Apr. 28, 2005

(30) Foreign Application Priority Data

Oct. 28, 2003    (TW) .............................. 92219095 U

(51) Int. Cl.
*H05K 7/20*    (2006.01)

(52) U.S. Cl. ...................... 361/704; 257/719; 361/719; 165/80.3

(58) Field of Classification Search ................ 165/185; 257/707, 713, 718, 719; 361/704, 707, 710, 361/719, 720
See application file for complete search history.

(56) References Cited

U.S. PATENT DOCUMENTS

| 6,014,315 A | * | 1/2000 | McCullough et al. ....... 361/704 |
| 6,330,908 B1 | | 12/2001 | Lee et al. |
| 6,336,499 B1 | * | 1/2002 | Liu ............................ 165/80.3 |
| 6,741,470 B2 | * | 5/2004 | Isenburg ..................... 361/704 |

FOREIGN PATENT DOCUMENTS

| TW | 498993 | 8/2002 |
| TW | 539393 | 6/2003 |

* cited by examiner

*Primary Examiner*—Greg Thompson
(74) *Attorney, Agent, or Firm*—Wei Te Chung

(57) ABSTRACT

A heat dissipation device (30) includes a heat dissipation member (31), a positioning member (33) and a mating member (34). The heat dissipation member includes a fin set (311) and a post (312) in the fin set. The post extends through the positioning member and is mated with the mating member so that the positioning member is positioned between the fin set and the mating member.

15 Claims, 3 Drawing Sheets

HEAT DISSIPATION DEVICE

BACKGROUND OF THE INVENTION

1. Field of the Invention

The present invention relates to a heat dissipation device, and particularly to a heat dissipation device having a central post which contacts an electronic component to be cooled.

2. Description of Prior Art

Electronics technology continues to boom unabated. Numerous modern electronic devices such as central processing units (CPUs) of computers operate at high speed and thus generate large amounts of heat. The heat must be efficiently removed from the CPU; otherwise, abnormal operation or damage may result. Typically, a heat sink with good thermal conducting capability is mounted onto the CPU to remove heat therefrom.

FIG. 3 shows a heat dissipation device for removing heat from an electronic component 10. The heat dissipation device comprises a fan 1, a fin member 2 and a central post 3. The fan 1 is mounted on the fin member 2 via a fan holder 4. The fin member 2 is formed by bending a continuous metal plate whereby each fin is U-shaped. The fin member 2 is radially arranged in a ring shape to define a central receiving hole 5 for closely receiving the central post 3 therein. The post 3 forms a circumferential projection 6 at an end thereof. In use of the heat dissipation device, a piece clip 7 with a central hole circles over the post 3. The fin member 2 receives the post 3 in the central receiving hole 5 and is bonded to the post 3. The clip 7 is engaged with the protrusions 9 of a socket 8 so that the projection 6 of the post 3 is pressed by the clip 7 toward the electronic component 10. Thus, the post 3 of the heat dissipation device is attached to the electronic component 10 for transferring heat therefrom.

However, the clip 7 circles over the post 3 prior to the engagement of the post 3 with the fin member 2. This obstructs the engagement of the post 3 with the fin member 2. During fitting of the clip 7 to the protrusions 9, force exerts on the clip 7 which is prone to be interfered with the electronic component 10. This takes a risk of damaging the electronic component 10. Furthermore, the clip 7 is not powerful enough to prevent the heat dissipation device, especially these having bulky volumes, from swaying during shock or vibration. In short, the heat dissipation device cannot be easily and safely positioned to the electronic component 10.

SUMMARY OF THE INVENTION

Accordingly, an object of the present invention is to provide a heat dissipation device which can be conveniently assembled.

A further object of the present invention is to provide a heat dissipation device which can be firmly and safely positioned to an electronic component.

In order to achieve the objects set out above, a heat dissipation device in accordance with a preferred embodiment of the present invention comprises a heat dissipation member, a positioning member and a mating member. The heat dissipation member includes a fin set and a post in the fin set. The post extends through the positioning member and is mated with the mating member so that the positioning member is positioned between the fin set and the mating member. In the present invention, the positioning member is positioned between the fin set and the mating member by means of an engagement of the mating member and the post. That is, whether the positioning member is positioned depends on whether the mating member has been mated with the post. For a heat dissipation device, especially for these having discrete fins and post, this design is greatly convenient to be assembled.

Other objects, advantages and novel features of the present invention will become more apparent from the following detailed description when taken in conjunction with the accompanying drawings, in which:

DETAILED DESCRIPTION OF THE INVENTION

Figure 1:
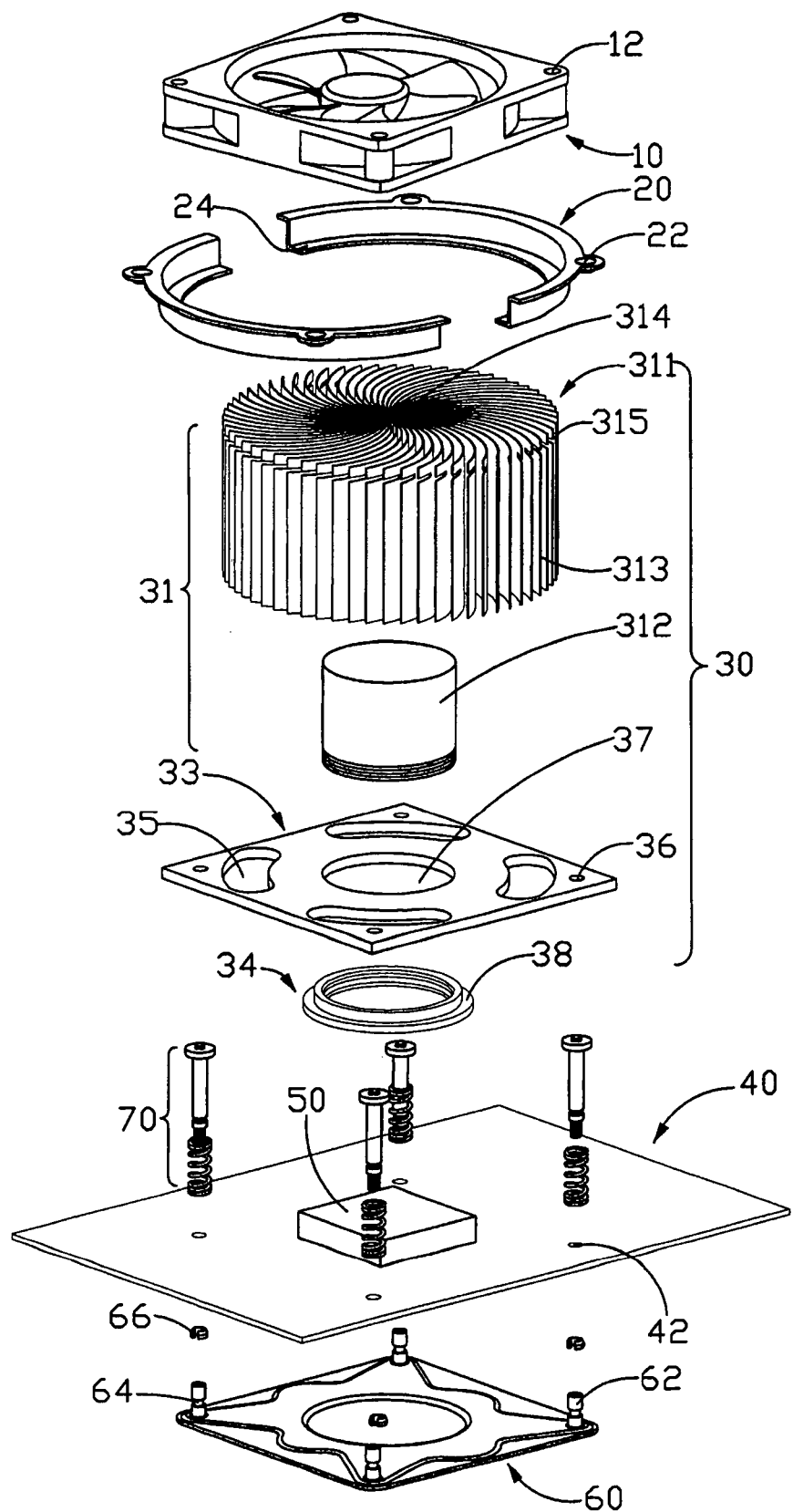
FIG. 1 is an exploded, isometric view of a heat dissipation device in accordance with the preferred embodiment of the present invention, and pertinent components.
Figure 2:
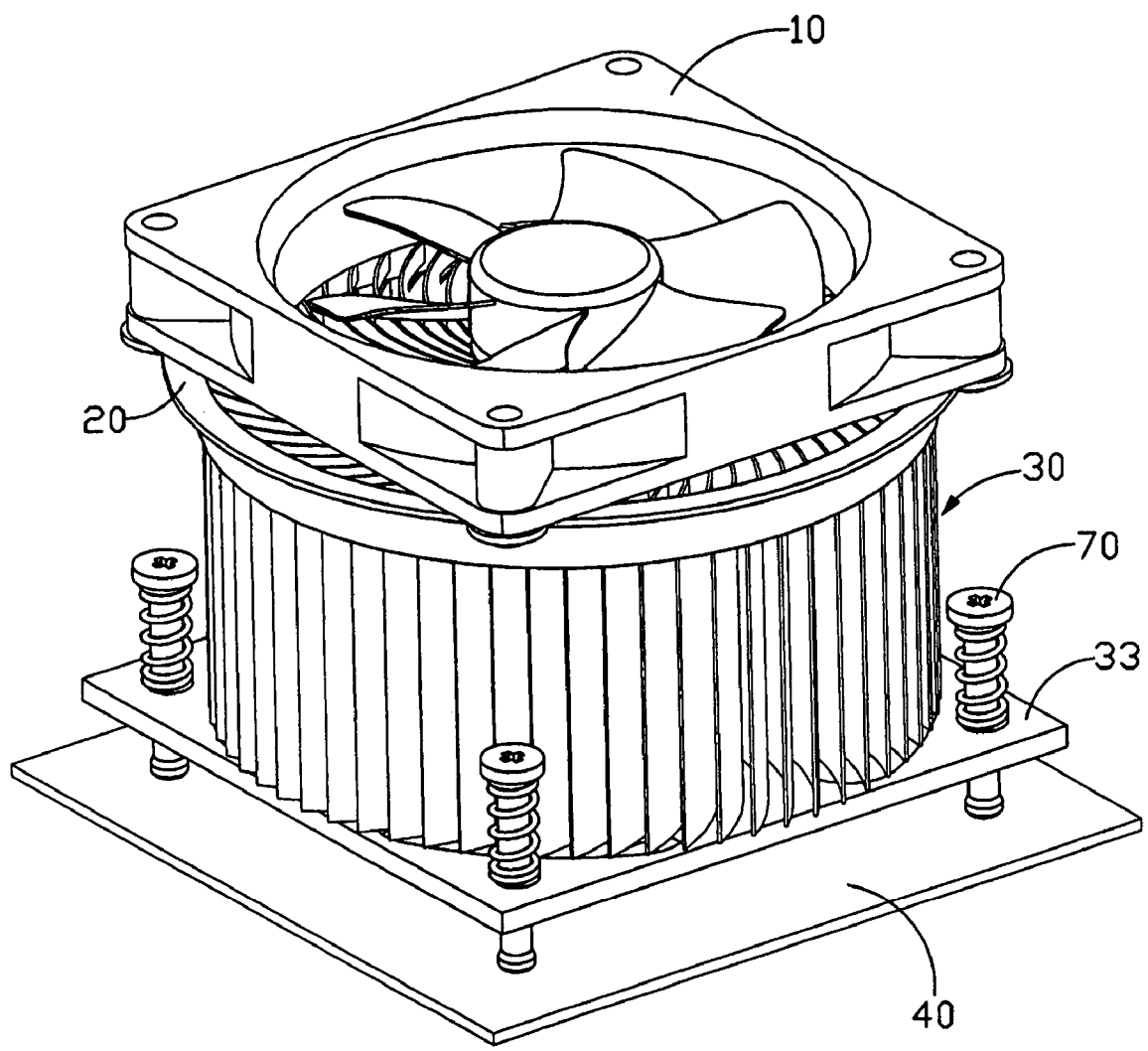
FIG. 2 is an assembled view of FIG. 1.
Figure 3:
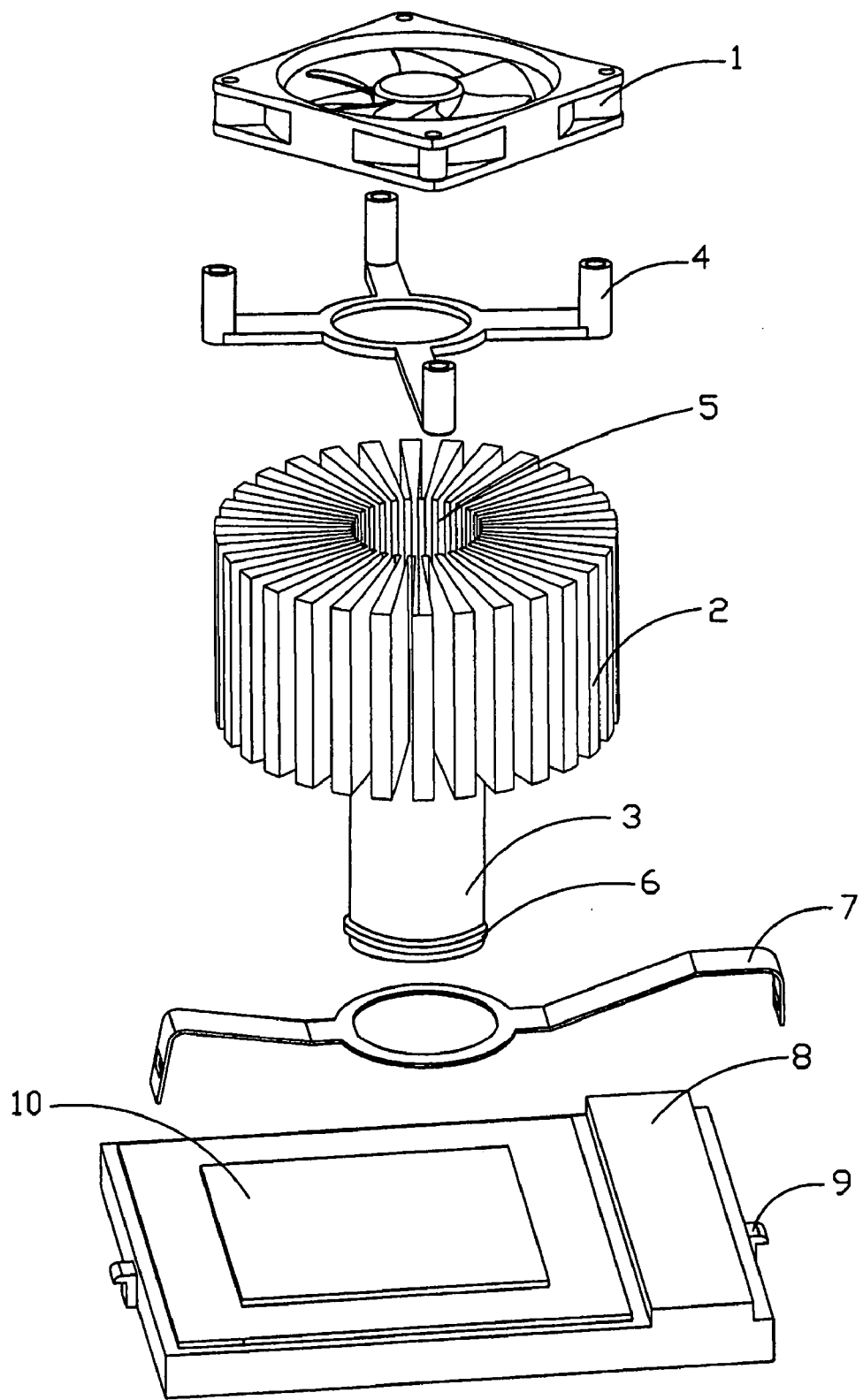
FIG. 3 is an exploded, isometric view of a conventional heat dissipation device and pertinent components.

Referring to FIGS. 1–2, a heat dissipation device 30 in accordance with the preferred embodiment of the present invention comprises heat dissipation member 31, a positioning member 33 and a mating member 34. In use of the heat dissipation device 30, the heat dissipation device 30 is mounted to an electronic component, such as a central processing unit (CPU) 50 via four fasteners 70, such as screws. The CPU 50 is mounted on a printed circuit board (PCB) 40. A backplate 60 underlies the PCB 40 and is engaged with the fasteners 70. A fan 10 is supported on the heat dissipation device 30 via a fan holder 20.

The PCB 40 defines four through holes 42 separate from and evenly around the CPU 50. The backplate 60 comprises four pins 62 extending perpendicularly therefrom, the pins 62 corresponding to the through holes 42 of the PCB 40. Each pin 62 defines inner thread at a top portion along an axial direction thereof, and an annular groove 64 at a substantially central portion thereof for receiving a nab 66 after the pins 62 extend through the through holes 42 so that the backplate 60 is mounted to the PCB 40.

The fan 10 defines four fixing holes 12 at four corners thereof. The fan holder 20 has four locating holes 22 corresponding to the fixing holes 12 and forms an inner brim 24 at a bottom thereof. Fixtures (not shown) can be inserted into the fixing holes 12 of the fan 10 and the locating holes 22 of the fan holder 20 to secure the fan 10 to the heat dissipation member 31 of the heat dissipation device 30.

The heat dissipation member 31 comprises a fin set 311 and a post 312. The fin set 311 comprises a plurality of radially curved fins 313 each having a flange (not labeled) extending from an inner edge thereof. The flanges of the fins 313 cooperatively define a central receiving hole 314 wholly or partly filled by the post 312. Each fin 313 has a cutout 315 defined from an outmost edge of a top portion thereof for receiving the brim 24 of the fan holder 20 therein, thereby supporting the fan 10 to the heat dissipation member 31. The post 312 has an end (not labeled) thereof threaded. The threaded end of the post 312 is distal from the ends of the fins 313 where the cutouts 315 are defined.

The positioning member 33 is a substantially rectangular planar plate. An opening 37 is defined in a substantially central portion of the positioning member 33, allowing the post 312 to insert therethrough. Four vents 35 are defined in the positioning member 33, evenly around the opening 37 and communicating with gaps between the fins 313, allowing air flow from the fan 10 to a surrounding of the CPU 50. Four fitting holes 36 are defined in the positioning member 33, being outmost relative to the opening 37 and the vents 35. The fitting holes 36 correspond to the through holes 42 of the PCB 40 respectively.

The mating member 34 which underlies the positioning member 33, is a substantial collar having inner surface threaded. A step 38 extends perpendicularly and outwardly from a bottom edge of the mating member 34, for abutting against a bottom surface of the positioning member 33. The post 312 has its bottom surface exposed from the mating member 34 for contacting the CPU 50.

In assembly of the heat dissipation device 30, the post 312 and the fin set 311 are engaged with each other, and then fixed together. The mating member 34 is threadedly mated with the threaded end of the post 312. The positioning member 33 is fitly sandwiched between the fin set 311 and the step 38 of the mating member 34, with the post 312 in the opening 37.

In use of the heat dissipation device 30, the heat dissipation device 30 is placed on the CPU 50 with the post 312 contacting a surface of the CPU 50. The fitting holes 36 of the positioning member 33 correspond to the through holes 42 of the PCB 40. The fasteners 70 are inserted through the fitting holes 36 and engaged with the pins at the threaded top portion; thus, the heat dissipation device 30 is secured to the CPU 50. It is understood that there can be no backplate 60 and that the fasteners 70 can directly engage with the PCB 40 to secure the heat dissipation device 30.

In the present invention, the fin set 311 can be engaged with the post 312 before the positioning member 33 because the mating member 34, which holds the positioning member 33 around the post 312, is separate from the post 312 before the heat dissipation device 30 is assembled. This greatly facilitates the engagement of the fin set 311 to the post 312. The fitting holes 36 are defined in an outmost portion of the positioning member 33. Force points on the positioning member 33 are located at the fitting holes 36 which are corresponding to the through holes 42 separate from the CPU 50. This stabilizes the heat dissipation device 30 when put to use. At the same time, it is safe to the CPU 50 during securing of the heat dissipation device 30 thereto.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
   a positioning member;
   a mating member; and
   a heat dissipation member comprising a fin set and a post in the fin set, the post further extending through the positioning member and mated with the mating member;
   wherein the positioning member is fitly sandwiched between the fin set and the mating member, and wherein the mating member comprises a step formed from a distal edge thereof opposite to the fin set, the step abutting agaitnst a surface of the positioning member.

2. The device of claim 1, wherein the fin set comprises a plurality of radial fins engaged to the post.

3. The device of claim 2, wherein each of the fins has a flange extending from an edge thereof facing the post, the flanges being in thermal contact with the post.

4. The device of claim 1, wherein the positioning member defines an opening therein, the opening receiving the post therein.

5. The device of claim 4, wherein the opening is disposed at a substantially middle of the positioning member.

6. The device of claim 4, wherein the positioning member defines a plurality of vents therein around the opening, the vents communicating with gaps between the fins.

7. The device of claim 4, wherein the positioning member defines a plurality of fitting holes therein for insertion of fasteners thereby positioning the heat dissipation device.

8. The device of claim 7, wherein the fitting holes are defined in an outmost portion of the positioning member and evenly around the opening.

9. The device of claim 1, wherein the post and the mating member are threadedly engaged with each other.

10. A heat dissipation assembly comprising:
    an electronic component;
    a printed circuit board supporting the electronic component thereon, the printed circuit board defining a plurality of voids therein around the electronic component;
    a heat dissipation device comprising a post, a fin set, a positioning member and a mating member, wherein the fin set, the positioning member and the mating member are successively arranged at a circumference of the post which contacts the electronic component, the mating member being mated with the post to position the positioning member between the fin set and the mating member, the positioning member defining a plurality of fitting holes therein corresponding to the voids; and
    a plurality of fasteners inserted through the fitting holes and the voids to secure the heat dissipation device.

11. The assembly of claim 10, wherein the mating member is threadedly mated with the post.

12. The assembly of claim 10, wherein the mating member comprises a step formed from a distal edge thereof opposite to the fin set, the step abutting against a surface of the positioning member.

13. The assembly of claim 10, wherein the fin set is fixedly engaged to the post.

14. The assembly of claim 10, wherein the positioning member defines an opening therein, the opening receiving the post therein.

15. A heat dissipation assembly comprising:
    a printed circuit board;
    a heat generating device located on the printed circuit board;
    a positioning plate located above and fastened to the printed circuit board in a parallel relation;
    a heat sink including a central post with a plurality of spaced fins in surrounding contact with said post; and
    a mating member being discrete from the positioning plate and defining a first section grasping a bottom portion of the post and a second section pressed downwardly by said positioning plate;
    wherein said heat generating device is essentially located between said positioning plate and said printed circuit board.

* * * * *